(12) United States Patent
Kim et al.

(10) Patent No.: US 8,174,186 B2
(45) Date of Patent: May 8, 2012

(54) ORGANIC ELECTROLUMINESCENT DEVICE AND METHOD FOR FABRICATING THE SAME

(75) Inventors: Chang Nam Kim, Seoul (KR); Ho Nyun Lee, Kyungki-do (KR)

(73) Assignee: LG Display Co., Ltd., Seoul (KR)

( * ) Notice: Subject to any disclaimer, the term of this patent is extended or adjusted under 35 U.S.C. 154(b) by 127 days.

(21) Appl. No.: 12/481,426

(22) Filed: Jun. 9, 2009

(65) Prior Publication Data
US 2009/0243481 A1    Oct. 1, 2009

Related U.S. Application Data

(62) Division of application No. 11/113,997, filed on Apr. 26, 2005, now Pat. No. 7,559,820.

(30) Foreign Application Priority Data

Apr. 27, 2004    (KR) .................. 10-2004-0029006

(51) Int. Cl.
*H01L 51/52* (2006.01)
(52) U.S. Cl. ........................ 313/504; 313/498
(58) Field of Classification Search ............ 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25
See application file for complete search history.

(56) References Cited

U.S. PATENT DOCUMENTS

| | | | |
|---|---|---|---|
| 6,046,543 A | 4/2000 | Bulovic et al. | |
| 6,280,861 B1 * | 8/2001 | Hosokawa et al. | 428/690 |
| 2003/0011301 A1 * | 1/2003 | Sasaoka et al. | 313/506 |
| 2003/0201447 A1 | 10/2003 | Yamazaki et al. | |
| 2004/0017153 A1 | 1/2004 | Nishikawa | |

FOREIGN PATENT DOCUMENTS

| | | | |
|---|---|---|---|
| CN | 1468038 A | | 1/2004 |
| JP | 2003017273 A | * | 1/2003 |
| JP | 2003133057 A | | 5/2003 |
| JP | 2004006332 A | | 1/2004 |

OTHER PUBLICATIONS

Misra, A., et al.; "Effects of Ion Irradiation on the Residual Stresses in Cr Thin Films"; Applied Physics Letters, American Institute of Physics, vol. 73, No. 7, Aug. 17, 1998, pp. 891-893 (XP-012021951).

* cited by examiner

*Primary Examiner* — Peter Macchiarolo
*Assistant Examiner* — Donald Raleigh
(74) *Attorney, Agent, or Firm* — Morgan, Lewis & Bockius LLP

(57) ABSTRACT

An organic EL device based on top emission and a method for fabricating the same are disclosed. The organic EL device includes a substrate, a thin film transistor (TFT) formed on the substrate, a planarization film formed on the entire surface of the substrate including the TFT, a first electrode formed on the planarization film, having a surface at a corner area higher than a surface at a center area, an organic EL layer formed on the first electrode, and a second electrode formed on the organic EL layer.

4 Claims, 9 Drawing Sheets

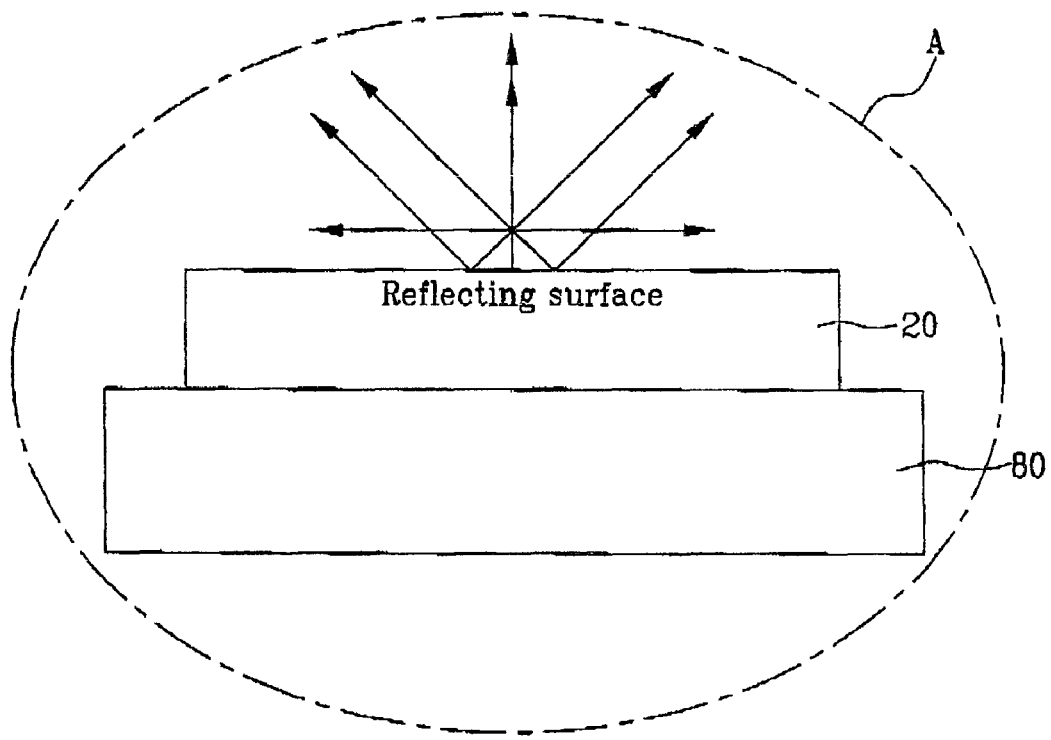

ORGANIC ELECTROLUMINESCENT DEVICE AND METHOD FOR FABRICATING THE SAME

This application is a Divisional application of U.S. patent application Ser. No. 11/113,997, filed Apr. 26, 2005. This application also claims the benefit of the Korean Patent Application No. 10-2004-0029006, filed on Apr. 27, 2004, which is hereby incorporated by reference as if fully set forth herein.

BACKGROUND OF THE INVENTION

1. Field of the Invention

The present invention relates to an organic electroluminescent (EL) device, and more particularly, to an organic EL device based on top-emission and a method for fabricating the same.

2. Discussion of the Related Art

Recently, studies or organic matters such as a conjugate polymer having conductivity have been actively performed since development of an organic EL device based on polyphenylenevinylene (PPV) that is one of the conjugate polymer. Studies for application of such organic matters to a thin film transistor (TFT), sensors, lasers, photoelectric device, and so on have been actively performed. Of them, studies of the organic EL device have been performed most actively. An inorganic EL device of inorganic matters based on phosphors requires an operational voltage of 200V or greater as an alternating current voltage and is fabricated by vacuum deposition. For this reason, the inorganic EL device has drawbacks. It is difficult to obtain a large-scaled inorganic EL device and particularly emit blue light. Also, the fabricating cost of the inorganic EL device is high.

However, the organic EL device of organic matters has advantages in that it has excellent light-emitting efficiency, facilitates a large-scaled area, and simplifies the process. Particularly, in the organic EL device of organic matters, it is possible to easily emit blue light and obtain an EL device that can be curved. In these respects, the organic EL device has received much attention as a next generation display device. Particularly, an active matrix EL device having an active driving device in each pixel is being actively studied as a flat panel display device in the same manner as a liquid crystal display (LCD) device.

FIG. 1 illustrates a related art active matrix organic EL device. Bottom emission is shown in FIG. 1, in which light is emitted toward a substrate. As shown in FIG. 1, a TFT 60 is formed on a substrate 10 of transparent glass, and an anode 20 is formed to overlap source and drain electrodes of the TFT 60. Subsequently, an insulating film 30 is formed on the TFT 60, and an organic EL layer 40 and a cathode 50 are sequentially formed on the entire surface of the insulating film 30.

In the aforementioned active matrix EL device based on bottom emission, a light-emitting portion is covered with the TFT 60 formed between the substrate 10 and the organic EL layer 40, when light emitted from the organic EL layer 40 is emitted through the substrate 10. In this case, an aperture ratio of the active matrix organic EL device is geometrically reduced if the size of the TFT 60 or the number of the TFTs 60 is increased. As a result, it is difficult to use the active matrix EL device as the display device. Therefore, to prevent the aperture ratio from, being reduced due to the TFT 60, top emission has been employed, in which light is emitted to an opposite surface of the substrate.

FIG. 2 illustrates a related art active matrix organic EL device based on top emission. As shown in FIG. 2, a TFT 60 is formed on a substrate 10, and a via hole is formed to expose source and drain electrodes of the TFT 60. A planarization film 80 is then formed on the entire surface of the substrate 10. An anode 20 is formed on the planarization film 80 to contact the source and drain electrodes of the TFT by way of the via hole. Subsequently, for electrical insulation, an insulating film 30 is formed in a contact region between the source and drain electrodes of the TFT 60 and the anode 20. An organic EL layer 40 and a cathode 50 are sequentially formed on the entire surface of the insulating film 30.

In the active matrix organic EL device based on top emission, the anode 20 serves as a reflecting surface to reflect light toward the cathode 50, and the reflected light is emitted to the outside through the cathode 50 that is a transparent electrode. however, since the anode is planarized in the organic EL device based on top emission, light reflected from the surface of the anode is scattered in all directions.

FIG. 3 is an enlarged view illustrating a portion A of FIG. 2 in detail. As shown in FIG. 3, since the surface of the anode 20 formed on the planarization film 80 is planarized, light reflected from the surface of the anode 20 is scattered in all directions. In this case, since an amount of light toward the cathode is small, light efficiency of the organic EL device is deteriorated.

SUMMARY OF THE INVENTION

Accordingly, the present invention is directed to an organic EL device and a method for fabricating the same that substantially obviate one or more problems due to limitations and disadvantages of the related art.

An object of the present invention is to provide an organic EL device and a method for fabricating the same in which an amount of externally emitted light is increased to improve light efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL device includes a substrate, a TFT formed on the substrate, a planarization film formed on the entire surface of the substrate including the TFT, a first electrode formed on the planarization film, having a surface at a corner area higher than a surface at a center area, an organic EL layer formed on the first electrode, and a second electrode formed on the organic EL layer.

The first electrode has a concave shaped surface, and has a section in a semicircle shape, a cylinder shape, a triangle shape, or a trapezoidal shape.

The first electrode may be a single layer consisting of either any one of metals such as Cr, Al, Au, Mo, Ti, and Ag, or their alloy. The first electrode may be formed in at least two layers made of the same materials as each other or different materials.

The first electrode has a thickness of 10 Å to 1000 Å.

In another aspect of the present invention, a method for fabricating an organic EL device includes the steps of forming a TFT on a substrate, forming a planarization film on the entire surface of the substrate including the TFT, forming a first electrode having a concave shaped surface by forming a metal material having tensile stress on the planarization film and patterning the metal material, forming an organic EL layer on the first electrode, and forming a second electrode on the organic EL layer.

The step of forming the first electrode includes the steps of forming a metal material having tensile stress on the planarization film, forming a mask film on the metal material and patterning the mask film, removing the metal material using the patterned mask film as a mask, and forming the first electrode having a concave shaped surface by removing the mask film remaining on the metal material.

The metal material having tensile stress is formed at a room temperature or a temperature greater than the room temperature. The temperature greater than the room temperature is between 50° C. and 400° C.

The tensile stress of the metal material is controlled by varying at least one or more of pressure, power, the distance between a target and the substrate, temperature, bias applied to the substrate, type of the substrate, deposition material, when the first electrode is formed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is an enlarged view illustrating a portion A of FIG. 2;

DETAILED DESCRIPTION OF THE INVENTION

Reference will now be made in detail to the preferred embodiments of the present invention, examples of which are illustrated in the accompanying drawings. Whenever possible, the same reference numbers will be used throughout the drawings to refer to the same or like parts.

Figure 1:
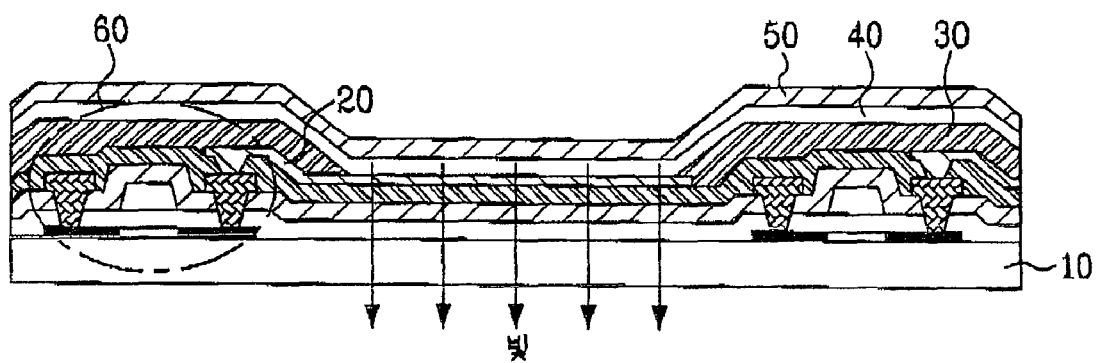
FIG. 1 illustrates a related art active matrix organic EL device based on bottom emission.
Figure 2:
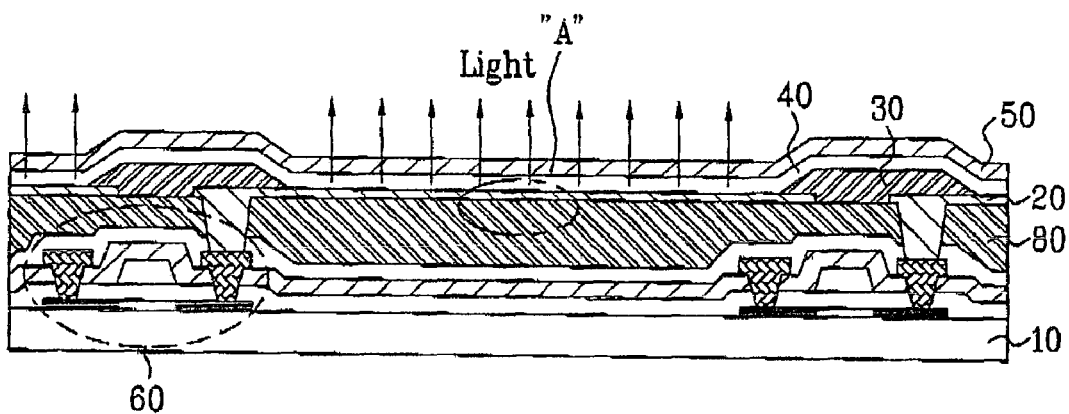
FIG. 2 illustrates a related art active matrix organic EL device based on top emission.
Figure 4A:
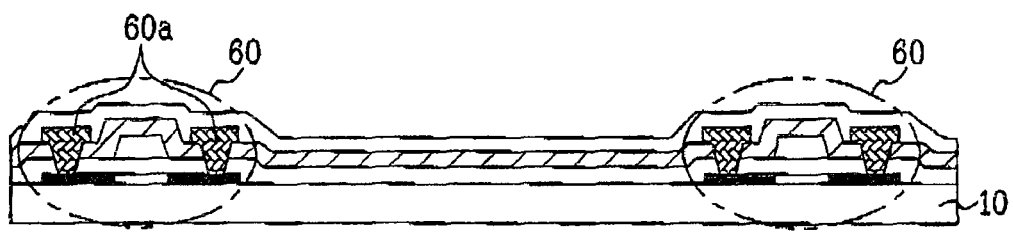
FIG. 4A to FIG. 4F are sectional views illustrating process steps of fabricating an organic EL device based on top emission according to the present invention.
Figure 4B:
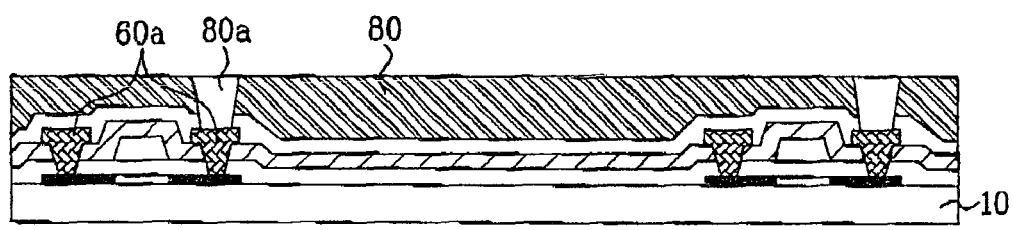

FIG. 4A to FIG. 4F are sectional views illustrating process steps of fabricating an organic EL device based on top emission according to the present invention. As shown in FIG. 4A, a TFT 60 having source and drain electrodes 60a is formed on a substrate 10. Subsequently, as shown in FIG. 4B, a planarization film 80 is formed on the entire surface of the substrate 10 including the TFT 60. A via hole 80a is then formed to expose the source and drain electrodes 60a.

Figure 4C:
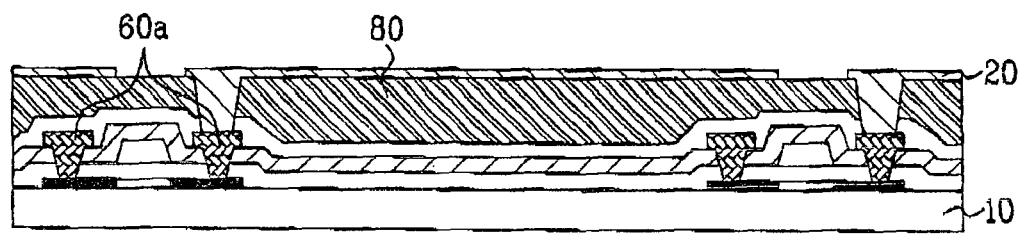

As shown in FIG. 4C, a metal material having tensile stress is formed on the planarization film 80 to be electrically connected with the source and drain electrodes 60a through the via hole 80g The metal material is then patterned to form a first electrode 20 having a concave shaped surface. The reason why the first electrode 20 having a concave shaped surface is formed will be described later.

Figure 4D:
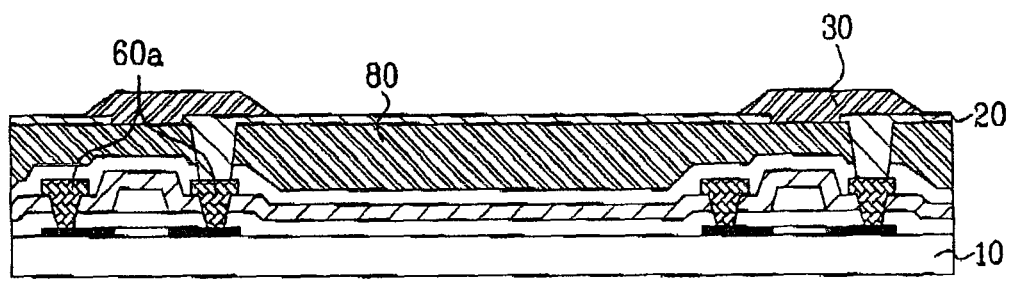
Figure 4E:
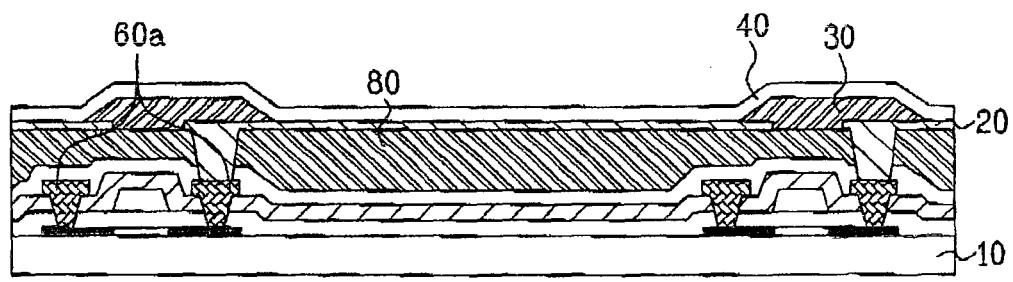

The section of the first electrode 20 has a semicircle shape, a cylinder shape, a triangle shape, or a trapezoidal shape. At this time, the first electrode 20 may be a single layer consisting of either any one of metals such as Cr, Al, Au, Mo, Ti, and Ag, or their alloy. The first electrode 20 may be formed of at least two or more layers made of the same material as each other or different materials. The first electrode 20 has a thickness of about 10 Å to 10000 Å. Subsequently, as shown in FIG. 4D, an insulating film 30 is formed in a contact region between the first electrode 20 and the source and drain electrodes 60a. As shown in FIG. 4E, an organic EL layer 40 is formed on the first electrode 20 including the insulating film 30.

Figure 4F:
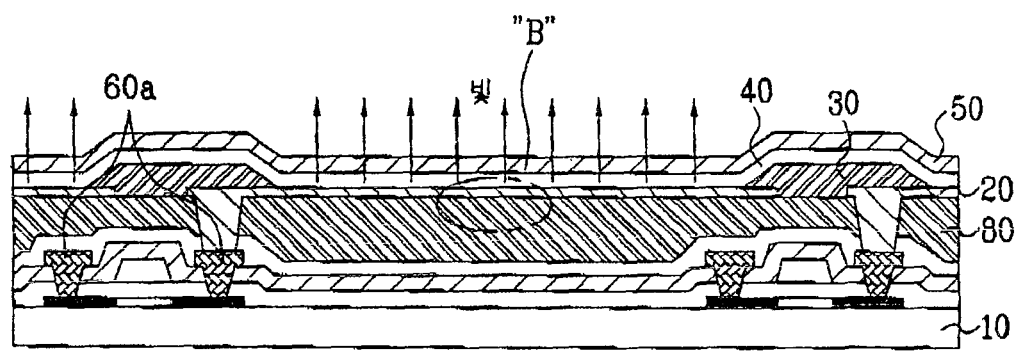

As shown in FIG. 4F, a second electrode 50 is formed on the organic EL layer 40. Thus, the organic EL device is finally fabricated. The first electrode 20 serves as an anode while the second electrode 50 serves as a cathode, and vice versa as the case may be. The aforementioned organic EL device of the present invention is characterized in a structure of the first electrode 20 that is an anode used as a reflecting surface of light. The structure of the first electrode 20 is applicable to the active matrix EL device based on top emission in which the anode is used as a reflecting surface.

Figure 5:
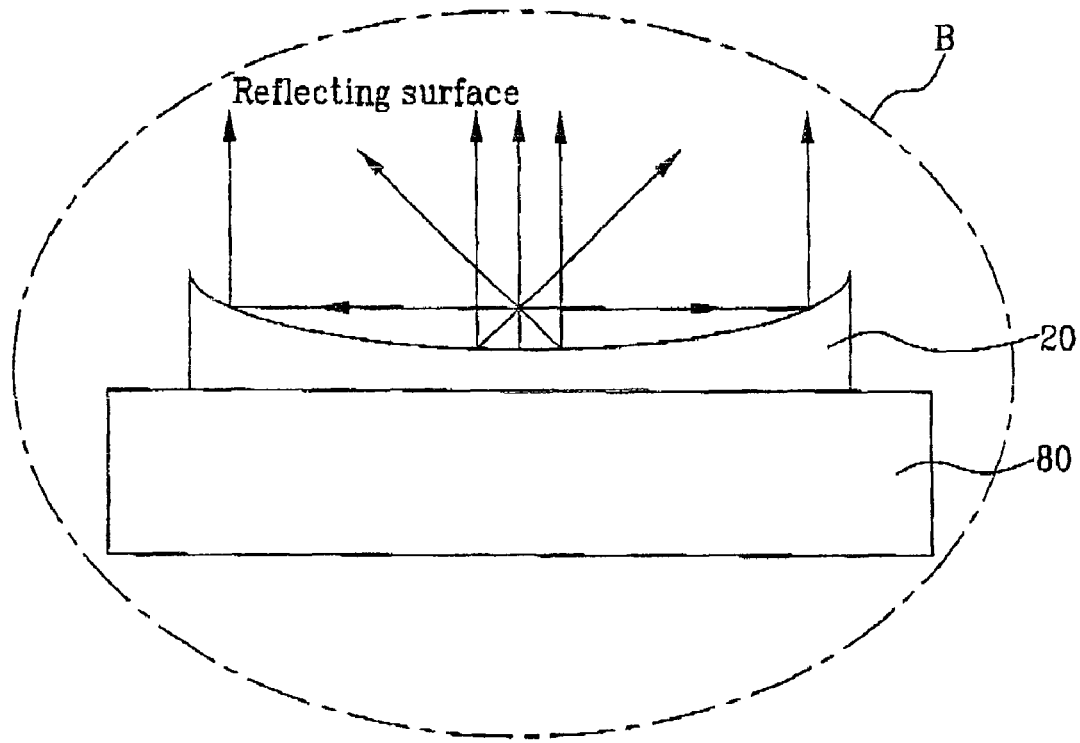
FIG. 5 is an enlarged view illustrating a portion B of FIG. 4F.

FIG. 5 is an enlarged view illustrating a portion B of FIG. 4F. Referring to FIG. 5, since first electrode 20 formed on the planarization film 80 has a concave shape, light is upwardly reflected to increase light efficiency. Plenty of light loss has occurred in the related art due to the planarized surface of the first electrode. However, since the first electrode of the present invention has a concave shape with a surface at a corner area higher than a surface at a center area, light loss is minimized to increase light efficiency. Furthermore, the same effect can be obtained even if the section of the first electrode has a semicircle shape, a cylinder shape, a triangle shape, or a trapezoidal shape. The process of fabricating the first electrode having the concave shape according to the present invention will be described in more detail.

Figure 6A:
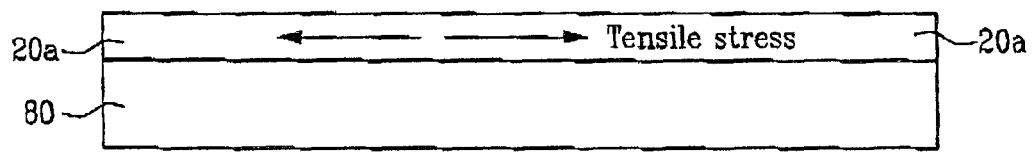
FIG. 6A to FIG. 6C are sectional views illustrating process steps of fabricating a first electrode according to the present invention.
Figure 6B:
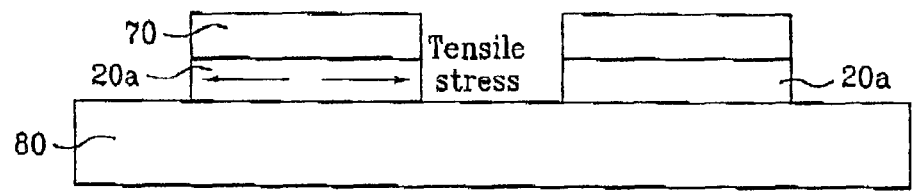
Figure 6C:
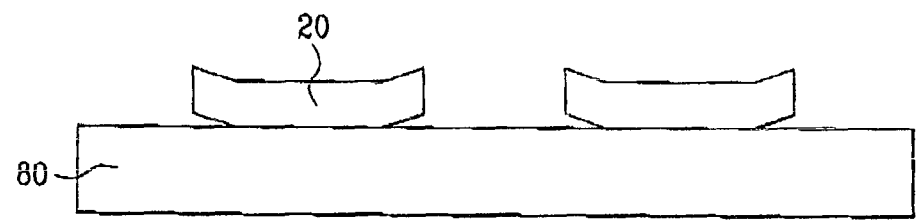

FIG. 6A to FIG. 6C are sectional views illustrating process steps of fabricating the first electrode according to the present invention. As shown in FIG. 6A, a metal material 20a having tensile stress is formed on the planarization film 80. Subsequently, as shown in FIG. 6B, a mask film 70 is formed on the metal material 20a and then is patterned to remove the metal material 20a using the patterned mask film 70 as a mask. As shown in FIG. 6C, the mask film 70 remaining on the metal material 20a is removed to form the first electrode 20 having a concave shaped surface. The mask film 70 may be a photoresist.

After the first electrode undergoes photolithography, the corner portion of the first electrode is floated from the surface of the planarization film by tensile stress of the first electrode. In this way, the first electrode can be fabricated in a concave shape. The metal material having tensile stress may be either any one selected from Cr, Al, Au, Mo, Ti, and Ag or their alloy. Cr may be formed at a room temperature while Al, Au, Mo, Ti, and Ag may be formed at a temperature greater than the room temperature. In other words, to obtain tensile stress, Cr is formed at a room temperature of about 20° C., and a metal, such as Al, Au, Mo, Ti, and Ag, or their alloy is formed at a temperature between 50° C. and 400° C., preferably 200° C.

Such tensile stress is varied by controlling deposition pressure, deposition power, the distance between a target and the substrate, temperature, bias applied to the substrate, and so on. Alternatively, the tensile stress is varied by changing a type of the substrate or a deposition material on the substrate. The first electrode may be formed in a single layered film. The first electrode may also be formed in a multi-layered film of at least two layers consisting of a resistance reducing film and the first electrode or a reflecting film and the first electrode. Furthermore, a general deposition process such as sputtering, electron-beam (E-beam), thermal evaporation, and chemical vapor deposition (CVD) may be used to form the first electrode. Preferably, E-beam or sputtering is used to form the first electrode considering quality of the deposited film.

EMBODIMENT

In the embodiment of the present invention, a Cr thin film was used as the metal material of the first electrode that is an anode, and the first electrode was deposited at a room temperature using DC sputtering. Stress of the substrate was measured with varying deposition power, deposition pressure, and thickness of the thin film. Subsequently, the stress of the substrate was calculated by measuring a curvature of the substrate before and after depositing the thin film, using an equipment FLX-2320 by Tencor.

Figure 7A:
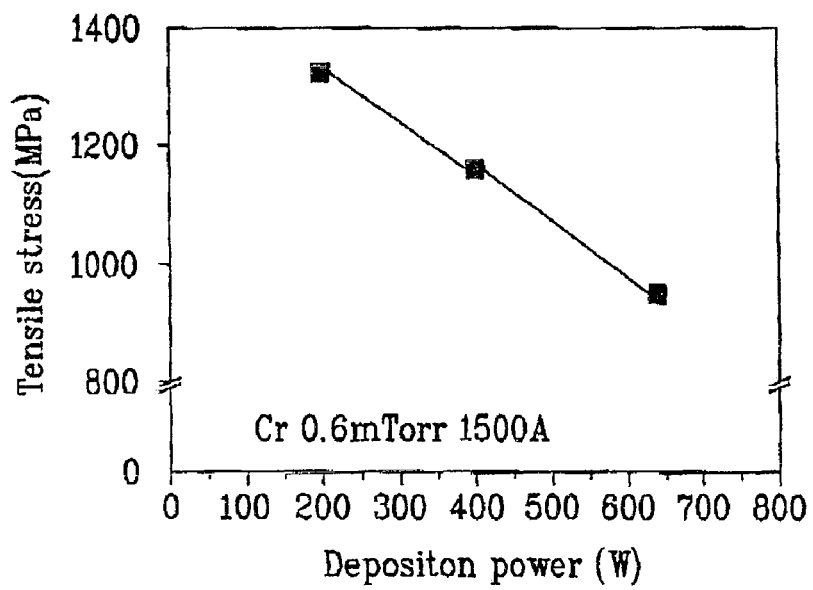
FIG. 7A to FIG. 7C are graphs illustrating tensile stress according to deposition power, deposition pressure and deposition thickness.
Figure 7B:
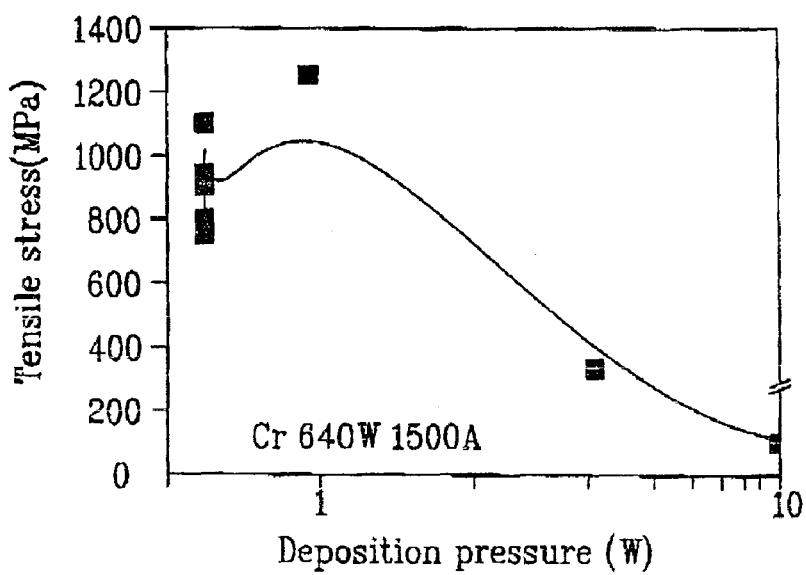
Figure 7C:
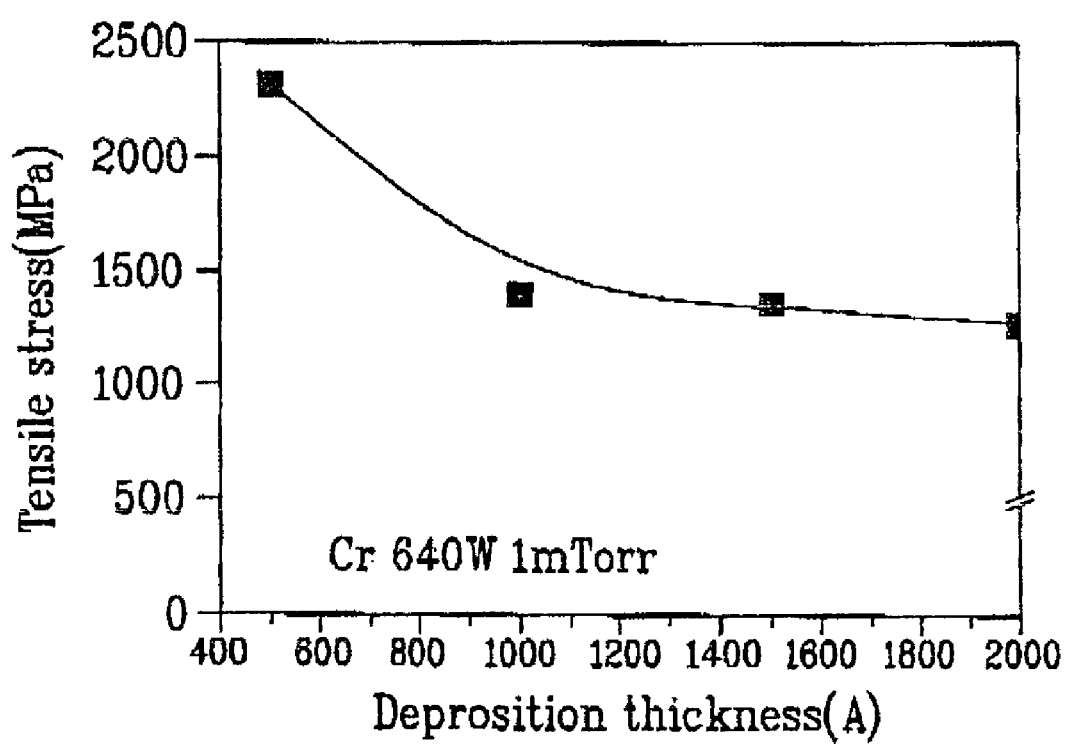

As shown in FIG. 7A, the tensile stress of the substrate is decreased to 1300 Mpa, 1150 Mpa, and 950 Mpa with increase of the deposition power to 200 W, 400 W, and 650 W. Further, as shown in FIG. 7B, the tensile stress of the substrate is initially increased and then decreased with increase of the deposition pressure from 0.3 mTorr to 10 mTorr. As shown in FIG. 7C, the tensile stress of the substrate is decreased from 2230 MPa to 1225 MPa and is uniformly maintained with increase of the deposition thickness from 500 Å to 2000 Å.

Based on the above results, the Cr thin film whose stress is susceptibly varied at a deposition thickness less than about 1000 Å was respectively formed on the substrate at thickness of 300 Å, 600 Å, and 1000 Å and underwent photolithography. By way of a sample deposited with a Cr thin film of 600 Å or less having tensile stress of about 2000 MPa or greater, it was identified that the first electrode has a concave shape. However, in case of a sample deposited with a Cr thin film of 1000 Å having tensile stress of 1500 MPa, it was the first electrode does not have a concave shape.

As described above, the shape of the first electrode can be controlled by controlling the tensile stress of the thin film. At this time, the tensile stress of the thin film can be varied by controlling deposition pressure, deposition power, the distance between the target and the substrate, temperature, bias applied to the substrate, and so on, as described above. Also the tensile stress of the thin film can be varied by changing the type of the substrate or the deposition material on the substrate.

As described above, the organic EL device and the method for fabricating the same according to the present invention have the following advantage. In the organic EL device based on top emission, the anode having a concave shape is used to increase the amount of light emitted to the outside, thereby increasing light efficiency.

It will be apparent to those skilled in the art that various modifications and variations can be made in the present invention without departing from the spirit or scope of the inventions. Thus, it is intended that the present invention covers the modifications and variations this invention provided they come within the scope of the appended claims and their equivalents.

What is claimed is:

1. An organic electroluminescent (EL) device comprising:
   a substrate;
   a thin film transistor (TFT) formed on the substrate;
   a planarization film formed on the entire surface of the substrate including the TFT;
   a first electrode formed on the planarization film, having a concave shaped surface at a corner area higher than a surface at a center area, wherein the corner portion of the first electrode is floated from the surface of the planarization film by tensile stress of the first electrode;
   an organic EL layer formed on the first electrode; and
   a second electrode formed on the organic EL layer;
   wherein the first electrode is a single layer having a thickness of 600 Å; and
   wherein the first electrode has a tensile stress of 2000 MPa.

2. The organic EL device according to claim 1, wherein the first electrode has a section in a semicircle shape, a cylinder shape, a triangle shape, or a trapezoidal shape.

3. The organic EL device according to claim 1, wherein the first electrode is a single layer consisting of either any one of metals such as Cr, Al, Au, Mo, Ti, and Ag, or their alloy.

4. An organic electroluminescent (EL) device comprising:
   a substrate;
   a thin film transistor (TFT) formed on the substrate;
   a planarization film formed on the entire surface of the substrate including the TFT;
   a first electrode formed on the planarization film, having a concave shaped surface at a corner area higher than a surface at a center area, wherein the first electrode is formed by forming a metal material having tensile stress on the planarization film at a temperature of 200° C. and patterning the metal material, wherein the corner portion of the first electrode is floated from the surface of the planarization film by tensile stress of the first electrode;
   an organic EL layer formed on the first electrode; and
   a second electrode formed on the organic EL layer;
   wherein the first electrode is a single layer consisting of Cr having a thickness of 600 Å; and
   wherein the first electrode has a tensile stress of 2000 MPa.

* * * * *